(12) United States Patent
Froeschl et al.

(10) Patent No.: US 8,265,891 B2
(45) Date of Patent: Sep. 11, 2012

(54) METHOD FOR DETERMINING THE ACTUAL AMOUNT OF ENERGY AVAILABLE IN AN ENERGY STORAGE MODULE

(75) Inventors: Joachim Froeschl, Herrsching (DE); Tobias Handschuh, Stuttgart (DE); Sebastian Reischl, Bruckmuehl (DE); Alexander Mai, Munich (DE)

(73) Assignee: Bayerische Motoren Werke Aktiengesellschaft, Munich (DE)

( * ) Notice: Subject to any disclaimer, the term of this patent is extended or adjusted under 35 U.S.C. 154(b) by 151 days.

(21) Appl. No.: 12/689,662

(22) Filed: Jan. 19, 2010

(65) Prior Publication Data

US 2010/0121592 A1    May 13, 2010

Related U.S. Application Data

(63) Continuation of application No. PCT/EP2008/005871, filed on Jul. 17, 2008.

(30) Foreign Application Priority Data

Jul. 20, 2007  (DE) .......................... 10 2007 034 044

(51) Int. Cl.
*G01R 31/36* (2006.01)
*G01R 19/00* (2006.01)
*H02J 7/06* (2006.01)
*H02J 7/16* (2006.01)

(52) U.S. Cl. ............. 702/63; 702/64; 320/132; 320/149

(58) Field of Classification Search .................... 702/63, 702/64, 189; 324/433, 426, 428, 434; 429/50, 429/92, 432, 452, 61, 428, 90; 320/132, 320/149, 130, 103, 106, 118, 119, 120, 122, 320/148, 134, 136

See application file for complete search history.

(56) References Cited

U.S. PATENT DOCUMENTS 5,321,627 A    6/1994  Reher
(Continued)

FOREIGN PATENT DOCUMENTS

DE    29 48 251 A1    6/1981
(Continued)

OTHER PUBLICATIONS

German Search Report dated Apr. 24, 2008 with English translation (nine (9) pages).

(Continued)

*Primary Examiner* — Mohamed Charioui
*Assistant Examiner* — Ricky Ngon
(74) *Attorney, Agent, or Firm* — Crowell & Moring LLP

(57) ABSTRACT

The amount of energy actually available in an energy storage module having a plurality of individual storage elements connected in series is determined. An upper and/or a lower limit voltage for the energy storage module is determined dynamically. During a charging operation of the energy storage module, in the event that a maximally permissible upper cell voltage is reached on at least one storage cell, the upper limit voltage of the energy storage module is determined by summing all cell voltages of all storage elements existing at that point-in-time. During a discharging operation, if a minimally permissible lower cell voltage is reached on at least one storage element, the lower limit voltage is determined by summing all cell voltages existing at that point-in-time. The actually available amount of energy is computed as a function of the determined limit voltage or voltages and of the determined actual storage capacity.

14 Claims, 3 Drawing Sheets

U.S. PATENT DOCUMENTS

| | | | |
|---|---|---|---|
| 5,578,915 | A | 11/1996 | Crouch, Jr. et al. |
| 5,656,915 | A * | 8/1997 | Eaves .......................... 320/118 |
| 5,850,136 | A | 12/1998 | Kaneko |
| 6,163,133 | A | 12/2000 | Laig-Horstebrock et al. |
| 6,285,163 | B1 | 9/2001 | Watanabe et al. |
| 6,379,826 | B1 | 4/2002 | Lacy |
| 6,504,344 | B1 * | 1/2003 | Adams et al. ................. 320/132 |
| 6,586,130 | B1 | 7/2003 | Guiheen et al. |
| 6,888,468 | B2 * | 5/2005 | Bertness .................. 340/636.15 |
| 7,034,475 | B2 * | 4/2006 | Kato et al. .................... 318/139 |
| 7,148,656 | B2 * | 12/2006 | Sodeno ......................... 320/132 |
| 7,492,160 | B2 | 2/2009 | Bolz |

FOREIGN PATENT DOCUMENTS

| | | | |
|---|---|---|---|
| DE | 34 07 409 | A1 | 9/1985 |
| DE | 35 33 437 | A1 | 3/1987 |
| DE | 195 33 445 | A1 | 3/1997 |
| DE | 198 47 648 | A1 | 4/2000 |
| DE | 693 28 513 | T2 | 8/2000 |
| DE | 100 56 843 | A1 | 5/2001 |
| DE | 699 09 472 | T2 | 5/2004 |
| DE | 103 47 110 | B3 | 1/2005 |
| DE | 195 45 833 | B4 | 10/2005 |
| DE | 10 2005 025 616 | A1 | 12/2006 |
| DE | 10 2005 029 890 | A1 | 1/2007 |
| DE | 601 19 565 | T2 | 1/2007 |
| EP | 0 851 556 | A2 | 7/1998 |
| EP | 1 688 754 | A2 | 8/2006 |
| WO | WO 2006/019360 | A1 | 2/2006 |
| WO | WO 2007/104325 | A1 | 9/2007 |

OTHER PUBLICATIONS

International Search Report dated Apr. 3, 2009 with English translation (twelve (12) pages).

* cited by examiner

METHOD FOR DETERMINING THE ACTUAL AMOUNT OF ENERGY AVAILABLE IN AN ENERGY STORAGE MODULE

CROSS-REFERENCE TO RELATED APPLICATIONS

This application is a continuation of PCT International Application No. PCT/EP2008/005871, filed Jul. 17, 2008, which claims priority under 35 U.S.C. §119 to German Patent Application No. DE 10 2007 034 044.5, filed Jul. 20, 2007, the entire disclosures of which are herein expressly incorporated by reference.

BACKGROUND AND SUMMARY OF THE INVENTION

The invention relates to a method for determining the actually available amount of energy of an energy storage module having a plurality of individual storage elements connected in series.

In the case of known energy storage systems, the actually available amount of energy is determined analogous to the present state of charge while using a high-expenditure sensor system. For battery or accumulator systems, the state of charge (SOC) of the energy storage device can be determined by using current sensors by ampere hour metering. Here, the state of charge (indicated, for example, as a percentage between 0% equaling discharged and 100% equaling fully charged) supplies only inexact information concerning the amount of energy of an energy storage system actually available. In the case of an energy storage device constructed as a capacitor, the state of charge is indicated, for example, in correlation with the output voltage of the capacitor. However, aging or defects may have the result that the accumulator or the capacitor, for example, can no longer be fully discharged, in which case the actual amount of energy that is usable is less than suggested by the state of charge of the energy storage device. As a result of the ampere hour metering known from the state of the art for determining the state of charge of accumulator or battery systems or the like, individual cells of the storage device may be overloaded sporadically during the operation of the system which, in turn, leads to a reduction of the useful life of the storage system.

It is an object of the invention to eliminate the above-described disadvantages and to provide a method of determining the actually available amount of energy in an energy storage device, by which the actually available amount of energy can be determined more precisely. Furthermore, it is an object of the invention to use as few additional components as possible for the conversion and to thereby arrive at a space- and cost-saving solution.

According to the invention, a method is provided for determining the actually available amount of energy in an energy storage module having a plurality of storage cells connected in series. For determining the available amount of energy, voltage limits (limit voltages) are dynamically determined or "learned" and are linked to an also determined storage capacity (actual capacity). According to the invention, it is provided that, in particular, at least one voltage limit (the upper or the lower voltage limit) is dynamically determined and, by way of this voltage limit, in connection with the determined actual storage capacity of the energy storage module, the actually available amount of energy in the energy storage module is determined. The other of the two voltage limits can also be predetermined as an invariable fixed value.

In a particularly preferred embodiment of the invention, a lower limit voltage as well as an upper limit voltage is dynamically determined for the energy storage module—and thereby virtually a dynamic voltage window is determined. In this case, the upper limit voltage will be determined in that, during a charging operation of the energy storage module, as soon as a maximally permissible upper cell voltage (for example, a manufacturer-specific maximally permissive upper voltage) has been reached on at least one storage element, (a first condition signal is generated), the upper limit voltage of the energy storage module is determined by the summation of all cell voltages of all series-connected storage elements of the energy storage module existing at this point-in-time. Analogously, the lower limit voltage is determined in that, during a discharging operation of the energy storage module, as soon as a minimally permissible lower cell voltage (for example, a manufacturer-specific minimally permissible lower voltage) has been reached on at least one storage element, (a second condition signal is generated), the lower limit voltage of the energy module is determined by the summation of all cell voltages of all series-connected storage elements of the energy storage module existing at this point-in-time. The determination of the upper and/or the lower limit voltage takes place dynamically. The predetermined voltage limits of the storage cells are therefore advantageously monitored in a continuous manner. When the predetermined maximally permissible upper cell voltage is reached, the upper limit voltage of the energy storage module will be determined and/or when the minimally permissive lower cell voltage is reached/occurs, the lower limit voltage of the energy storage module is determined or redetermined.

For determining the maximally permissible upper or the minimally permissible lower cell voltage (over- and undervoltage determination for the individual cells), reference is made at this point to European patent document EP 851 556 A1 (having U.S. counterpart U.S. Pat. No. 5,850,136), as well as to international application PCT/EP2006/02291, which is not a prior publication, both of which are incorporated by reference herein. For example, by determining the under- and overvoltage for the individual cells, in the event of the appearance of a flag (indication of a signal condition or event), the respectively existing voltage value of the storage module is stored in this case.

In connection with the determination of the actual storage capacity, reference is made in this regard to German patent document DE 10 2005 025 616 A1, which is also incorporated by reference herein.

Within the meaning of the invention, the actual storage capacity of the energy storage module is the current maximal actual storage capacity of the energy storage module which, as a result of aging or defects or the like, in the course of the operating time (or useful life), as a rule, falls below the original value when new (first start-up). Within the meaning of the invention, the momentarily available amount of energy is the amount of energy which is actually available—thus, the amount of energy which is currently present within the scope of the actually existing voltage limits (lower and upper limit voltage) as well as the actual storage capacity of the energy storage module changed because of the possibly (in comparison to the condition when new (first startup)) changed limit voltages of the energy storage module.

Other objects, advantages and novel features of the present invention will become apparent from the following detailed description of one or more preferred embodiments when considered in conjunction with the accompanying drawings.

DETAILED DESCRIPTION OF THE DRAWINGS

Figure 1:
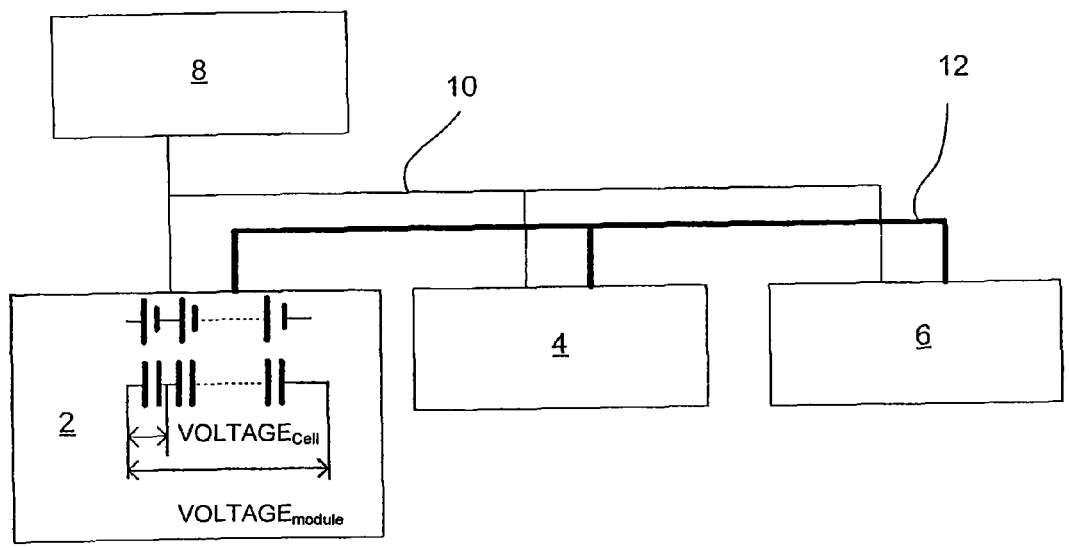
FIG. 1 is a schematic view of an electric system including an energy storage device, a consuming device or load, an energy generator as well as a control device.

FIG. 1 is a system connection diagram of an electrical system having an energy storage module 2 (onboard power supply battery and/or double-layer capacitor, or the like), an electric consuming device or load 4 (power steering booster, air-conditioning system, electric driving motor, . . . ), an electric energy generator device 6 (for example, a generator), and a higher-ranking control unit 8 (such as an onboard power supply control device), which are all mutually connected by way of an information transmission system 10, such as a CAN, a Flexray data bus, and/or the like. Furthermore, at least the electric energy storage module 2, the electric consuming device 4 (also representative of a plurality of electric consuming devices or loads of an onboard power supply system of a motor vehicle), as well as the electric energy generator device 6 are connected with one another by way of an energy bus 12.

Figure 2:
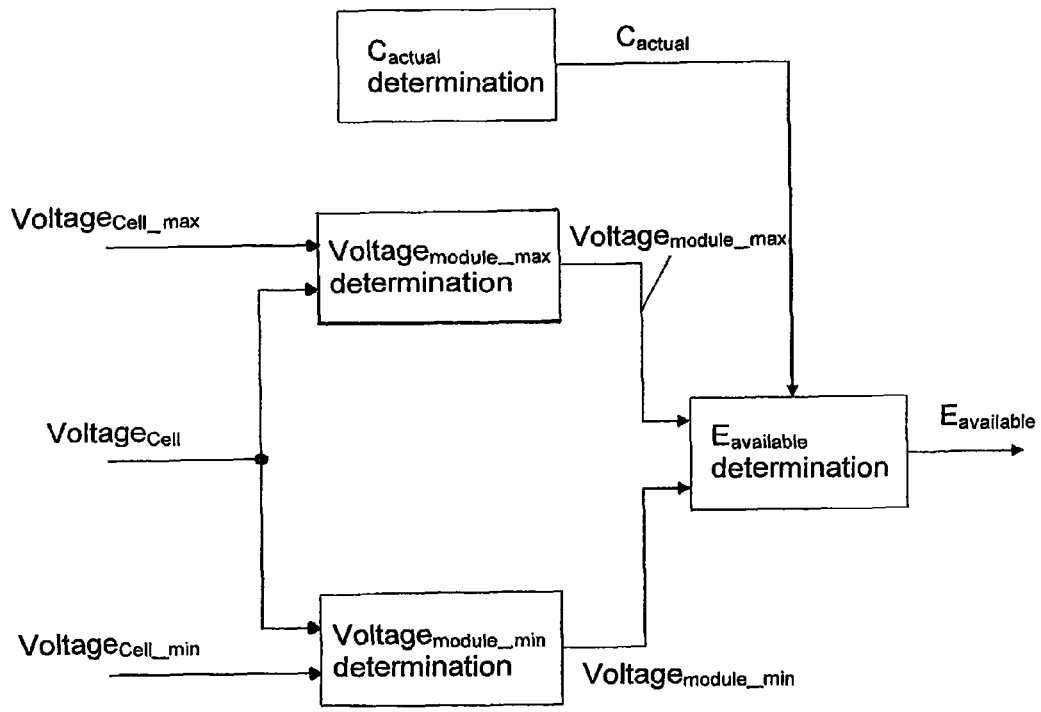
FIG. 2 is a functional block diagram of an embodiment for illustrating the method according to the invention.

The method in accordance with an embodiment of the invention, which is the basis of the energy management of an electric system according to FIG. 1, will be explained using the functional block diagram of FIG. 2. Accordingly, in a preferred embodiment, an upper limit voltage and a lower limit voltage of the energy storage module 2 consisting of a plurality of series-connected storage cells 2a are dynamically determined (in a continuous manner with respect to time). Subsequently, and additionally as a function of the determined actual storage capacity of the energy storage module 2, the actually available amount of energy is determined (in particular, it is computed in the control unit 8 using a stored computation model).

Figure 3:
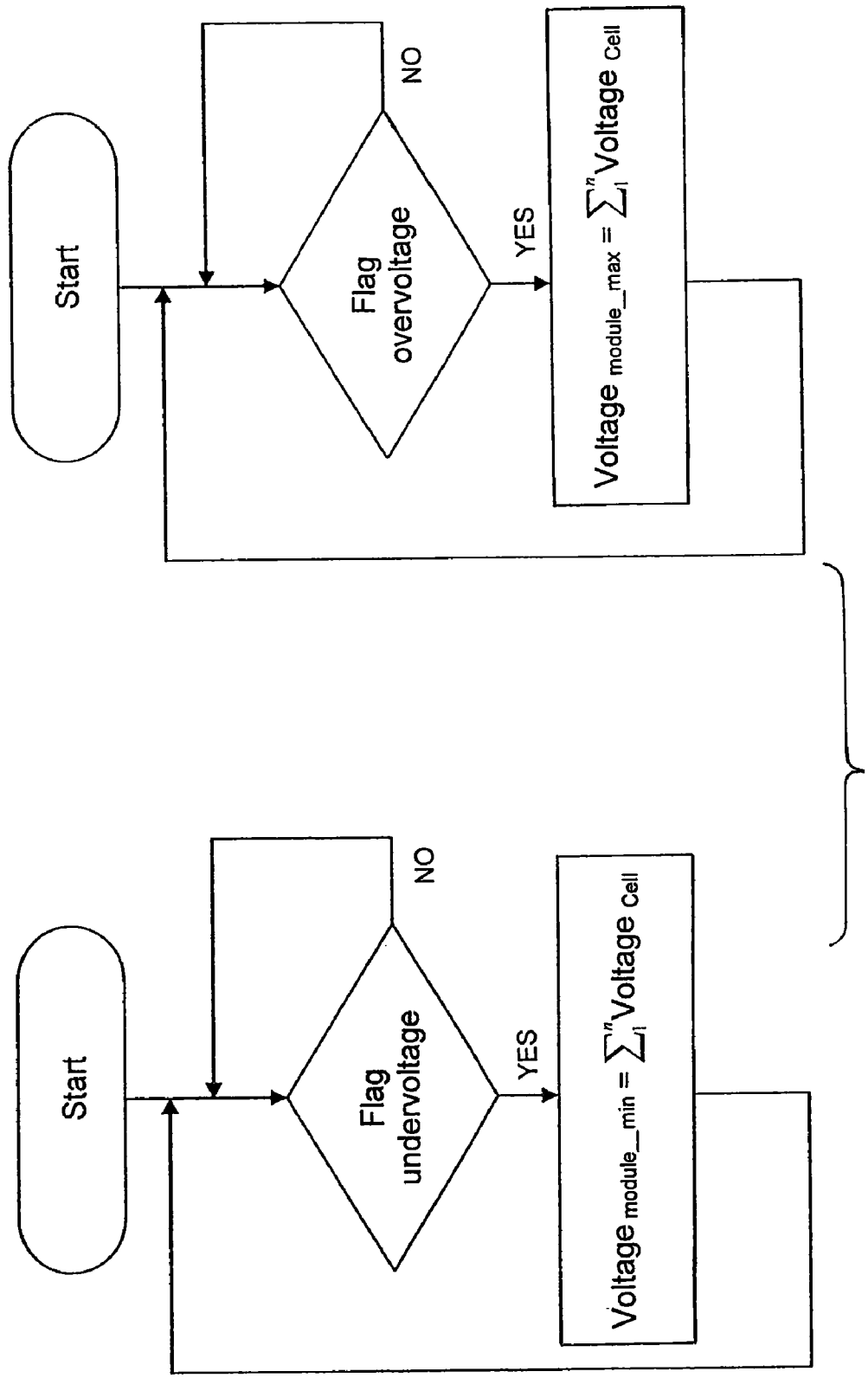
FIG. 3 is a flow chart illustrating the operating sequence when determining the maximally permissible upper cell voltage and the minimally permissible lower cell voltage, respectively.

For determining the upper and lower limit voltage $\text{Voltage}_{module\_max}$ and $\text{Voltage}_{module\_min}$, respectively, of the energy storage module 2, all storage cells 2a of the energy storage module 2 are monitored with respect to the occurrence/reaching of a maximally permissible upper, and a minimally permissible lower, cell voltage $\text{Voltage}_{cell\_max}$ and $\text{Voltage}_{cell\_min}$, respectively. A corresponding flag is set in each case in the event of the occurrence of a voltage limit (Step S1 and S1' respectively). In the event that such a predetermined voltage limit was reached in the case of a storage cell 2a and a corresponding flag was set, the corresponding limit voltage $\text{Voltage}_{module\_max}$ and $\text{Voltage}_{module\_min}$ respectively of the energy storage module 2 is determined in that, at the point-in-time at which a storage cell 2a is the first to reach its predetermined voltage limit, the cell voltages $\text{Voltage}_{cell}$ existing at this point-in-time are added up. This approach is illustrated in FIG. 3 (on the left, for the determination of the minimally permissible cell voltage, on the right for the determination of the maximally permissible cell voltage).

Figure 4:
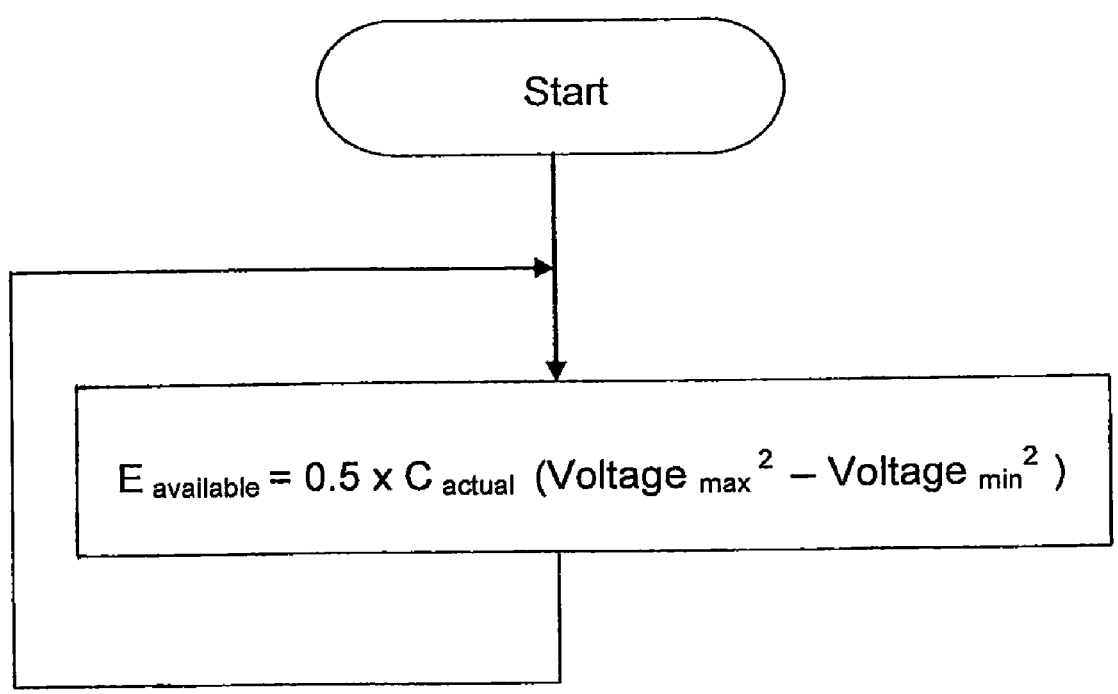
FIG. 4 is a flow chart for determining the actually available amount of energy in the energy storage module.

FIG. 4 illustrates the determination of the actually available amount of energy $E_{available}$ of the energy storage module 2, this amount being determined according to the formula:

$$E_{available} = 0.5 \times C_{actual}(\text{Voltage}_{module\_max}^2 - \text{Voltage}_{module\_min}^2)$$

When the available amount of energy $E_{available}$ falls below an applicable limit, the higher-ranking overall system will be switched to a degradation mode. In this case, individual selected consuming devices are supplied, for example, with a slightly lower electric power, so that, however, the desired availability (particularly with respect to the availability time) is not limited—or individual selected consuming devices are even switched-off and an at least slightly limited availability of the system is ensured. When a further (lower) limit value is reached or fallen below, the higher ranking system may be switched-off completely.

The frequency distribution of the available amount of energy $E_{available}$ over time or over vehicle operating conditions and, therefore, the available voltage window ($\text{Voltage}_{module\_max} - \text{Voltage}_{module\_min}$) forms a further source of information for diagnostic purposes. For example, because of excessively frequent time spent in the limit range (the energy storage module 2 or storage cell 2a reaches the lower limit voltage or the minimally permissible cell voltage more frequently than predetermined within a predetermined time period), a preventive exchange of the energy storage module 2 may be signaled.

In the event that only a certain amount of energy is required, the module voltage ($\text{Voltage}_{module} = f(\text{Voltage}_{module\_min}, C, E_{required})$) required for at the least the operation or partial operation of the system can then be determined and set by means of the previously known value of the "required available amount of energy" $E_{required}$, with the knowledge of the (currently actual) lower limit voltage $\text{Voltage}_{module\_min}$ of the energy storage module 2 and with the knowledge of the actual storage capacity $C_{actual}$ of the energy storage device by means of the formula:

$$\text{Voltage}_{module} = \sqrt{2 \times E_{required}/C_{actual} + \text{Voltage}_{module\_min}^2}$$

The foregoing disclosure has been set forth merely to illustrate the invention and is not intended to be limiting Since modifications of the disclosed embodiments incorporating the spirit and substance of the invention may occur to persons skilled in the art, the invention should be construed to include everything within the scope of the appended claims and equivalents thereof.

What is claimed is:

1. A method for determining an amount of energy actually available in an energy storage module having a plurality of individual storage cells connected in series, the method comprising the acts of:

determining dynamically, by a control unit operatively coupled with the energy storage module, an upper and a lower limit voltage for the energy storage module, wherein the following acts occur;

(a) during a charging operation of the energy storage module, upon reaching a maximally permissible upper cell voltage on at least one storage cell, the upper limit voltage of the energy storage module is determined by summing all cell voltages existing at that point-in-time for all of the plurality of individual storage cells; and (b) during a discharging operation of the energy storage module, upon reaching a minimally permissible lower cell voltage on at least one storage cell, the lower limit voltage of the energy module is determined by summing all cell voltages existing at that point-in-time for all of the plurality of individual storage cells;

determining, by the control unit, the amount of energy actually available in the energy storage module as a function of a determined actual storage capacity and the upper limit voltage and the lower limit voltage of the energy storage module.

2. The method according to claim 1, wherein the actual storage capacity of the energy storage module is determined by reading out a stored capacity value.

3. The method according to claim 2, wherein the stored capacity value is a variable capacity value.

4. The method according to claim 1, wherein the actual storage capacity of the energy storage module is determined by dynamically determining the capacity value by one of measuring and computing.

5. The method according to claim 1, wherein the act of determining the upper and/or the lower limit value of the energy storage module is carried out by reading out a stored voltage value.

6. The method according to claim 1, wherein the act of dynamically determining the upper and/or the lower limit voltage is carried out by at least one of measuring and computing.

7. The method according to claim 1, further comprising the act of:

generating a diagnostic signal as a function of a number of operating conditions of the energy storage module in which the minimally permissible lower cell voltage of a storage cell is reached within a predetermined time period or a particular operating mode of the electric system.

8. The method according to claim 1, wherein the energy storage module supplies an electric machine of a hybrid vehicle.

9. The method according to claim 1, wherein the maximally permissible upper cell voltage is a manufacturer-specific maximally permissive upper voltage, and the minimally permissible lower cell voltage is a manufacturer-specific minimally permissive lower voltage.

10. An electric system, comprising:

an energy storage module having a plurality of individual storage cells connected in series, the energy storage module being operatively configurable for supplying an electric machine of a hybrid vehicle;

a control unit operatively coupled with the energy storage module, the control unit including a non-transitory computer readable medium containing program code segments that determines dynamically, during a discharging operation of the energy storage module, upon reaching a minimally permissible lower cell voltage on at least one storage cell, a lower limit voltage of the energy storage module by summing all cell voltages existing at that point-in-time for all of the plurality of individual storage cells; and determines the amount of energy actually available in the energy storage module as a function of a determined actual storage capacity and the lower limit voltage of the energy storage module.

11. The electric system according to claim 10, wherein the minimally permissible lower cell voltage is a manufacturer-specific minimally permissive lower voltage.

12. A method for determining an amount of energy actually available in an energy storage module having a plurality of individual storage cells connected in series, the method comprising the acts of:

determining dynamically, by a control unit operatively coupled with the energy storage module, a lower limit voltage for the energy storage module, wherein during a discharging operation of the energy storage module, upon reaching a minimally permissible lower cell voltage on at least one storage cell, the lower limit voltage of the energy module is determined by summing all cell voltages existing at that point-in-time for all of the plurality of individual storage cells; and determining, by the control unit, the amount of energy actually available in the energy storage module as a function of a determined actual storage capacity and the lower limit voltage of the energy storage module.

13. The method according to claim 12, further comprising the act of:

generating a diagnostic signal as a function of a number of operating conditions of the energy storage module in which the minimally permissible lower cell voltage of a storage cell is reached within a predetermined time period or a particular operating mode of the electric system.

14. The method according to claim 12, wherein the minimally permissible lower cell voltage is a manufacturer-specific minimally permissive lower voltage.

* * * * *